United States Patent [19]

Suzuki

[11] Patent Number: 5,260,741
[45] Date of Patent: Nov. 9, 1993

[54] COPYING MACHINE AND CARTRIDGE FOR ACCOMMODATING PHOTOSENSITIVE SHEET

[75] Inventor: Tsuyoshi Suzuki, Nagoya, Japan
[73] Assignee: Brother Kogyo Kabushiki Kaisha, Aichi, Japan
[21] Appl. No.: 761,162
[22] Filed: Sep. 11, 1991
[30] Foreign Application Priority Data Sep. 14, 1990 [JP] Japan ................... 2-96745[U]
Sep. 14, 1990 [JP] Japan ................... 2-96747[U]

[51] Int. Cl.⁵ ............................ G03B 27/58
[52] U.S. Cl. ............................ 355/72; 355/27
[58] Field of Search ............ 355/27, 72; 354/174, 354/175; 352/78 R, 78 C

[56] References Cited

U.S. PATENT DOCUMENTS 4,782,365 11/1988 Takagi ..................... 352/78 C
4,864,362 9/1989 Hayashi .
4,987,047 1/1991 Yui et al. ..................... 354/275
5,023,653 6/1991 Yoshihara .
5,159,365 10/1992 Takahashi et al. ............ 354/275

Primary Examiner—Monroe H. Hayes
Attorney, Agent, or Firm—Kane, Dalsimer, Sullivan, Kurucz, Levy, Eisele and Richard

[57] ABSTRACT

A copying machine has a cartridge loading hole for detachably receiving a cartridge for accommodating a roll of photosensitive sheet. The cartridge comprises a cylindrical core with the photosensitive sheet wound thereon, a rear flange secured to one end of the core in close contact with an one end face of the roll of photosensitive sheet for shielding light from the same, a cylindrical core cap secured to the other end of the core and having a lock pawl capable of elastic deformation, a cover flange for covering the other end face of the roll therewith, the cover flange having two grooves engaged with the lock pawl in close contact with the other end face of the roll at a first position and engaged with the lock pawl in a state separated from the other end face thereof at a second position by pushing the core relative to the cover flange. Thus, no exclusive casing is needed.

12 Claims, 7 Drawing Sheets

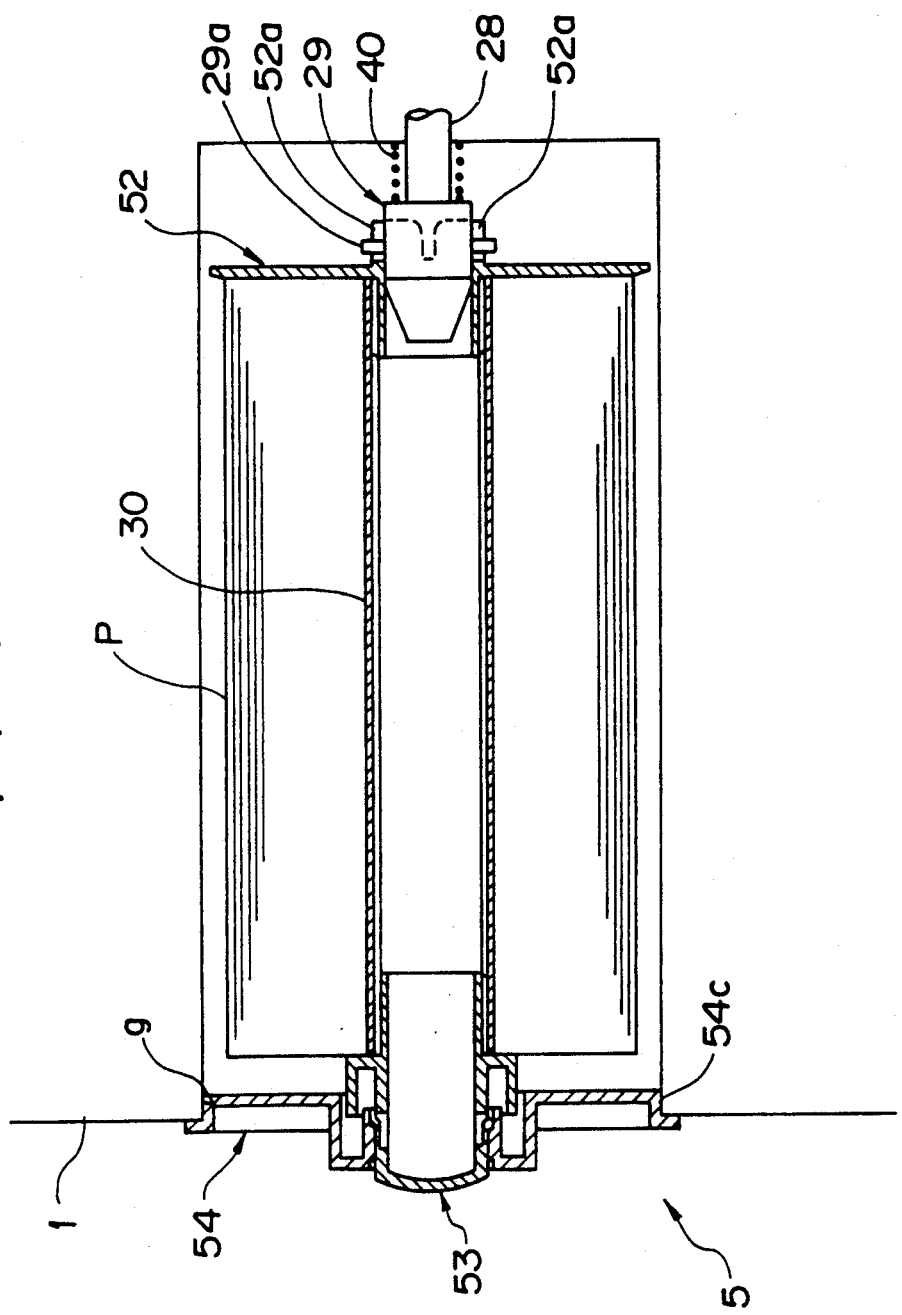

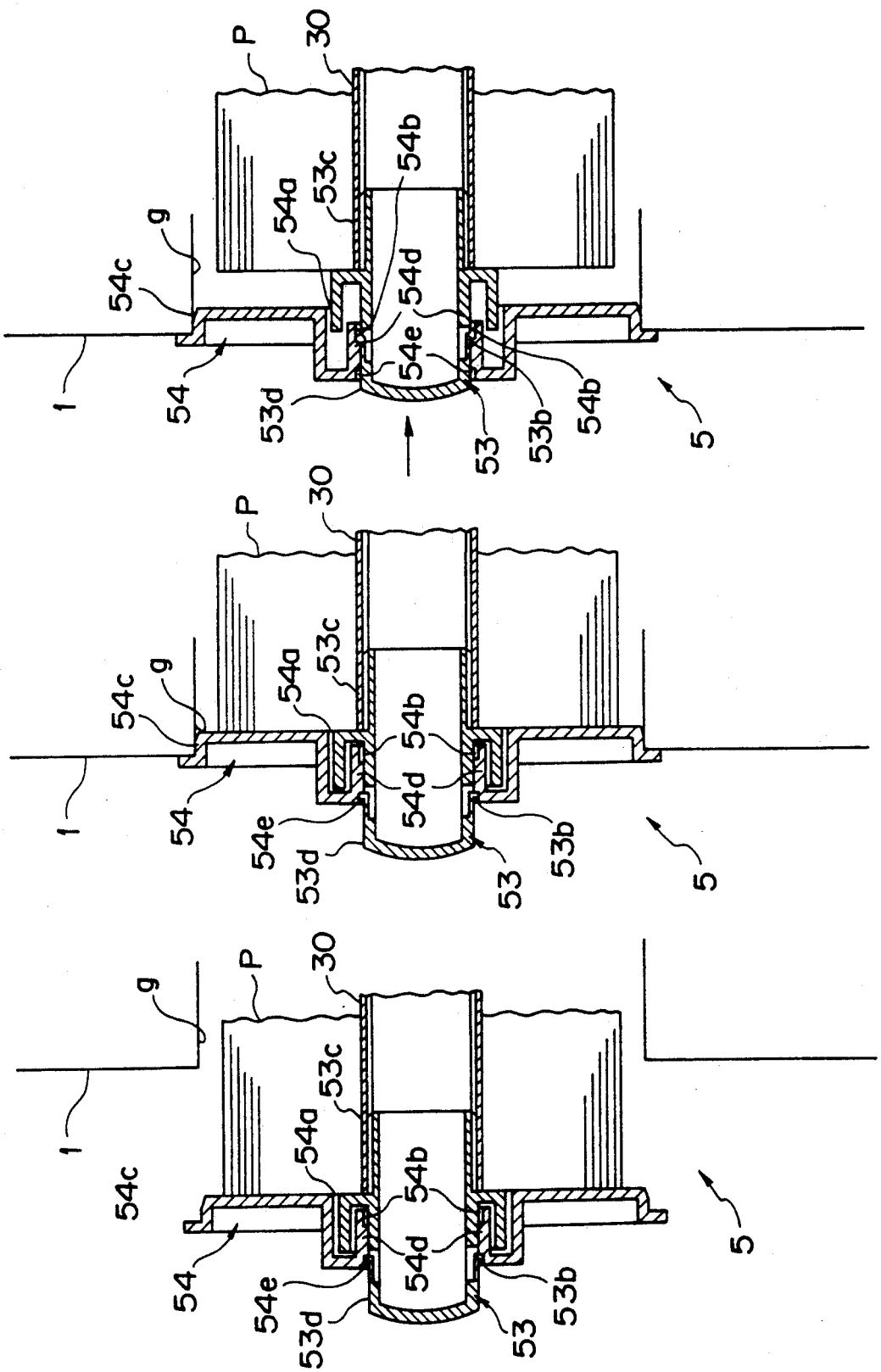

COPYING MACHINE AND CARTRIDGE FOR ACCOMMODATING PHOTOSENSITIVE SHEET

BACKGROUND OF THE INVENTION

This invention relates to a copying machine using a photosensitive sheet and a cartridge for accommodating the photosensitive sheet used for such a copying machine.

A conventional copying machine using a photosensitive sheet is provided with a light-shielding box-like casing therein for accommodating a photosensitive sheet in a light-shielded state, in which a core with the photosensitive sheet wound thereon and two flanges provided on the opposite ends of the core are rotatably supported. In use, a leading tape attached to the photosensitive sheet is taken out through an opening formed in the casing. In general, photosensitive sheets have different sensitivities and other characteristics depending on conditions of manufacturing them. Accordingly, when the copying machine is used, an operating condition in accordance with a cartridge loaded in the copying machine must be set. Therefore, information needed for the operating conditions in the copying machine is shown on the cartridge. More specifically, information necessary for correction of the operating condition in the copying machine is shown by providing a correction code on the casing of the cartridge or by providing a bar code on the leading film.

However, in the conventional copying machine in which the cartridge comprising a light-shielding box-like casing for accommodating a roll of photosensitive sheet wound on the core, it is necessary to open and close a body cover of the copying machine when a cartridge is replaced.

In addition, the conventional cartridge exclusively uses a light-shielding box-like casing for accommodating the photosensitive sheet wound on the core. The casing increases the size and price of the cartridge. This problem has been a cause of a high running cost of the conventional copying machine using such a cartridge.

Further, in a conventional cartridge whose casing has a printed correction code, a user is liable to input erroneously the information indicated by the correction codes to the copying machine. Besides, the operation of inputting the information needs a keyboard and is therefore cumbersome and time-consuming.

In the case of the conventional cartridge, in which a bar code is printed on its leading film, the bar code is printed only on a leading end portion of the leading film. Therefore, after the leading end portion has been taken up, the bar code can no longer be read out. Moreover, the leading film can be readily bent, thus making it difficult to read the code with a sensor and readily causing an erroneous reading.

U.S. Pat. No. 5,023,653 granted to Hideo YOSHIHARA discloses an image recording apparatus using a cartridge comprising an exclusive casing for accommodating a photosensitive sheet wound on a core. Since the cartridge with the exclusive casing in its body is used in the apparatus, it has a drawback of the necessity of opening and closing the body or the casing of the apparatus when the cartridge is replaced.

Moreover, U.S. Pat. No. 4,864,362 granted to Shigeyuki HAYASHI discloses a cartridge comprising an exclusive casing. Since this cartridge uses such a casing, its size is increased thereby. In addition, the use of the casing increases the cost of the cartridge as a whole.

SUMMARY OF THE INVENTION

An object of the invention is to provide a copying machine, which has no need of opening and closing any body cover when a cartridge is replaced and thus requires a reduced running cost.

Another object of the invention is to provide a cartridge for accommodating a photosensitive sheet, which has no need of an exclusive casing to decrease its price and has no need of opening and closing any body cover of a copying machine when the cartridge is replaced in the case of using the cartridge for the copying machine.

Additionally, another object of this invention is to provide a cartridge for accommodating a photosensitive sheet, which can easily and reliably read characteristics of the photosensitive sheet accommodated in the cartridge.

According to one aspect of this invention, there is provided a copying machine for performing a copying operation using a photosensitive sheet accommodated in a cartridge, which comprises: an outer body having a cartridge loading hole for receiving detachably said cartridge which accommodates a roll of photosensitive sheet in a light-shielding state; an original support section formed on said outer body; an exposure means for exposing said photosensitive sheet; a transferring means for transferring the photosensitive sheet along a guide path while the sheet is taken out of said cartridge; and a developing means for developing an image on said sheet onto a transfer sheet.

According to another aspect of this invention, there is provided a cartridge for accommodating a roll of photosensive sheet therein, which comprises: a core with the photosensitive sheet wound thereon; a rear flange secured to one end of said core in close contact with one end face of the roll of the photosensitive sheet for shielding light from the photosensitive sheet; a core cap secured to the other end of said core; a cover flange engaged with said core cap so as to cover the other end face of the roll for shielding light therefrom, said cover flange being detachably fitted into a cartridge loading hole formed in an outer body of a copying machine; and a locking means disposed between said core cap and cover flange for locking said core cap on said cover flange at a first and a second predetermined positions which are separated from each other in an axial direction of said core cap, said cover flange being in close contact with the other end face of the roll at said first position, said cover flange being separated from the other end face of the roll by pushing said core cap from said first position to said second position so that the roll is capable of rotating.

According to still another aspect of this invention, there is provided a copying machine for performing a copying operation using a photosensitive sheet, which comprises: a cartridge accommodating a roll of photosensitive sheet and having a rear flange provided at one end of said roll and a cover flange provided at the other end of said roll; an outer body having a cartridge loading hole for receiving detachably said cartridge, said cover flange being engaged with said cartridge loading hole; an original support section formed on said outer body; an exposure means for exposing said photosensitive sheet; a transferring means for transferring the photosensitive sheet along a guide path while the sheet is taken out of said cartridge; and a developing means for developing an image on said sheet onto a transfer sheet.

The copying machine according to the invention has a cartridge loading hole formed in the outer body of the copying machine, and the cartridge is detachably loaded into the cartridge loading hole. Thus, there is no need of opening and closing any body cover when the cartridge is replaced.

The cartridge according to the invention, has the cover flange which is held in a state engaged with the end face of the photosensitive sheet at a first position. In this state, the cover flange, the rear flange and the leading piece cooperate to shield light from the photosensitive sheet.

After the cartridge is inserted into the cartridge loading hole, the core cap is pushed inwardly. As a result, a lock pawl of the locking means is disengaged from a groove of the cover flange, and the end face of the roll is separated from the cover flange so that the roll can be rotated by pulling the photosensitive sheet.

Thus, no exclusive casing for shielding light from the photosensitive sheet is necessary. In addition, the cartridge may be loaded in the copying machine body or the like without need of opening or closing any body cover.

BRIEF DESCRIPTION OF THE DRAWINGS

In the accompanying drawing:

FIG. 10 is a sectional view showing the cartridge in a state loaded in a copying machine; and FIGS. 11(A) to 11(C) are fragmentary sectional views for explaining the operation of the cartridge in a state loaded in the copying machine, respectively.

DETAILED DESCRIPTION OF THE PREFERRED EMBODIMENT

An embodiment of the invention will now be described with reference to the accompanying drawings.

Figure 1:
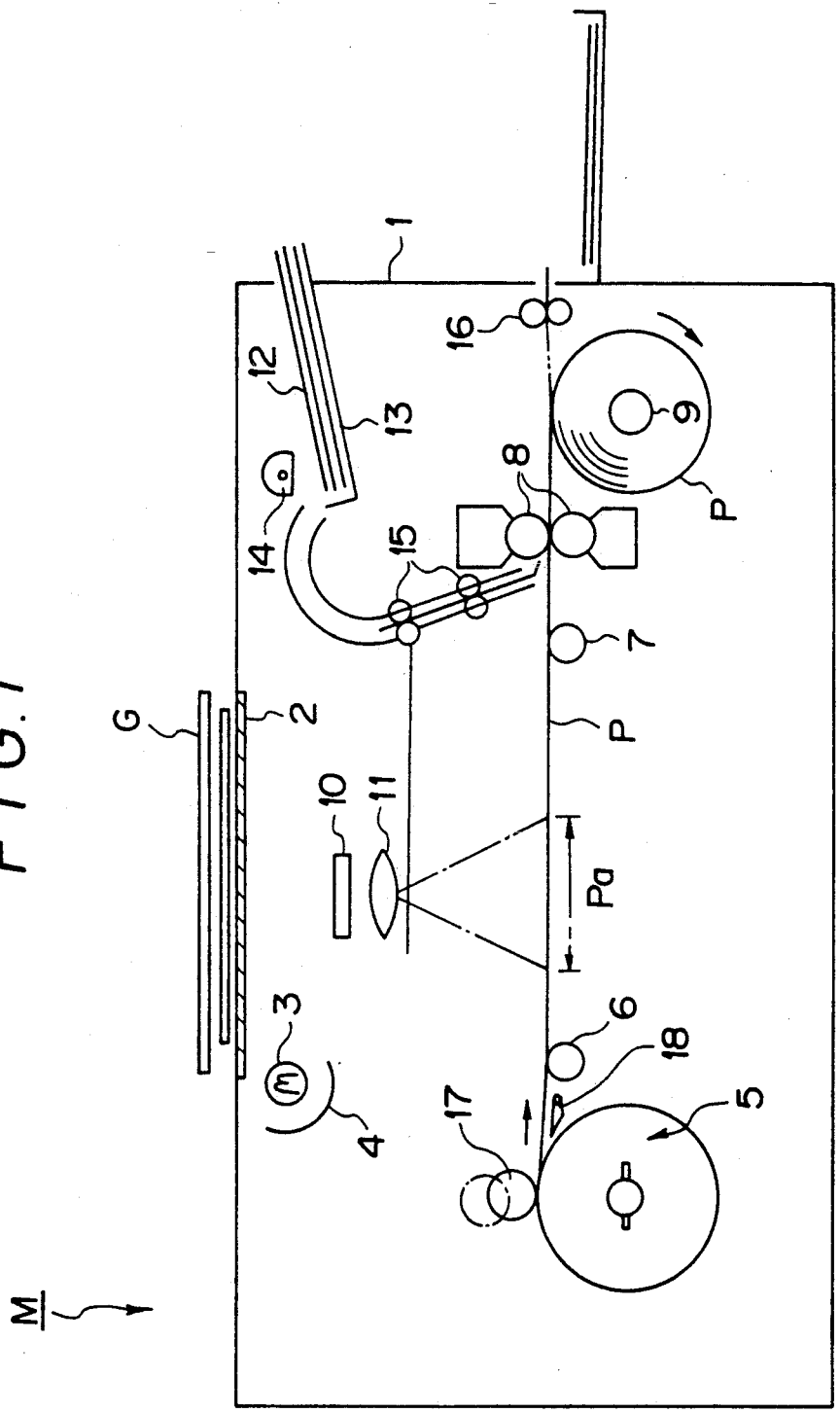
FIG. 1 is a schematic view showing an embodiment of the copying machine according to the present invention.

Referring to FIG. 1, there is shown a copying machine M according to the invention, which has an outer body 1 and a glass panel 2 forming an original support section provided on the top face of the body 1. Beneath the glass panel 2 are provided a light source 3 and a reflector 4 for projecting light toward an original G set on the panel 2. Designated at 5 is a cartridge, for accommodating a photosensitive sheet, which has a roll of photosensitive sheet P therein. The photosensitive sheet P has a coating of micro-capsules which are hardened when exposed to light. The micro-capsules are filled with a dye.

The photosensitive sheet P is taken out of the cartridge 5 by a take-out roller 17, and its leading end is led by a leading end introduction pawl 18 in the direction shown by an arrow shown in FIG. 1. The take-out roller 17 is rotated during operation at its operative position shown by a solid line in FIG. 1, while normally it is supported at an inoperative position shown by an imaginary line in FIG. 1.

The photosensitive sheet P which is introduced in this way is guided by a pair of guide rollers 6 and 7 disposed along a guide path for guiding the sheet P and a pair of pinch rollers 8 and 8 as a development means. It is eventually taken up on a take-up roller 9 which is rotated clockwise in FIG. 1. The distance between the guide rollers 6 and 7 is set at a distance predetermined by the size of the original G. The take-out roller 17, the guide rollers 6 and 7, etc. form a transferring means.

Beneath the glass panel 2 are also provided a shutter 10 and a converging lens 11, these elements as an exposure means serving to effect exposure of an exposure zone $P_a$ of the photosensitive sheet P for image formation. The shutter 10 may be a mechanical shutter or a liquid crystal shutter.

A copying sheet cassette 13 for accommodating copying sheets or transfer papers 12 is disposed in the copying machine body 1 on one side near one end thereof. The copying sheets 12 are supplied one by one from the copying sheet cassette 13 by a sheet supply roller 14 which is disposed near an outlet of the copying sheet cassette 13. Each copying sheet 12 supplied from the copying sheet cassette 13 is guided by a plurality of carrier rollers 15 to a pair of pinch rollers 8. The pinch rollers 8 as a developing means thus pinch both the copying sheet 12 and photosensitive sheet P having passed through the exposure zone $P_a$. Thus, both the non-exposed and exposed micro-capsules on the photosensitive sheet P are pressed against the copying sheet 12. At this time, the exposed micro-capsules are not crushed because they have been hardened by the exposure, but only the non-exposed micro-capsules are crushed to flow out the dye accommodated in them. This dye reacts with a coloring agent contained on the copying sheet 12, thus forming an image on the surface of the copying sheet 12.

The copying sheet 12 with an image formed in this way is separated from the photosensitive sheet P, which is taken up by the take-up roller 9, and discharged to the outside of the body 1 by a pair of separation rollers 16.

The cartridge 5 will now be described.

Figure 2:
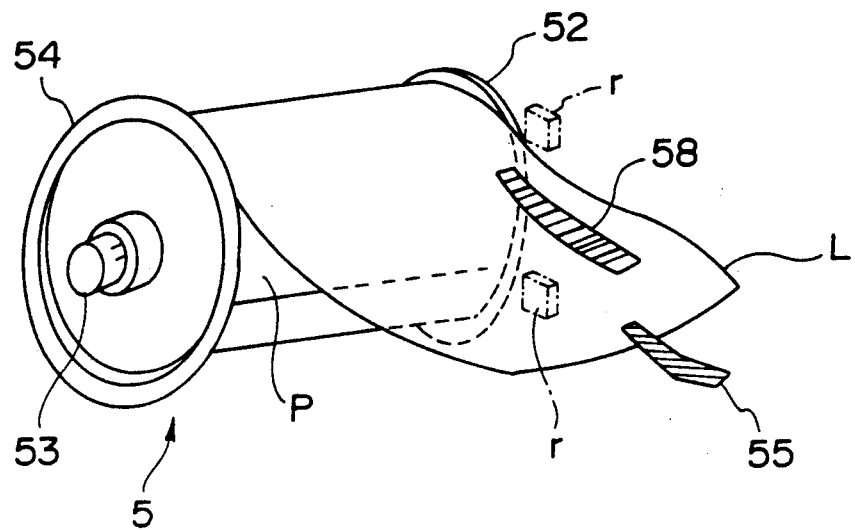
FIG. 2 is a perspective view showing an embodiment of a cartridge according to the present invention.

FIG. 2 is a perspective view showing the cartridge 5 according to the invention. The photosensitive sheet P is wound around a core 51 (FIG. 3), and it has a leading piece L attached to the end of the sheet P and having a light-shielding property. The surface of the leading piece L has a bar code 58 indicative of the characteristics or lot No. of the photosensitive sheet P. The leading piece L has a tape 55 attached to its front end. In the packed state of the roll of the photosensitive sheet P, the tape 55 is applied to the outer periphery of the roll to prevent unwinding of the leading piece L. In this state, the exposure of the photosensitive sheet P is prevented by the light-shielding leading piece L. For use, the tape 55 is removed to permit the leading piece L to be pulled out.

Figure 3:
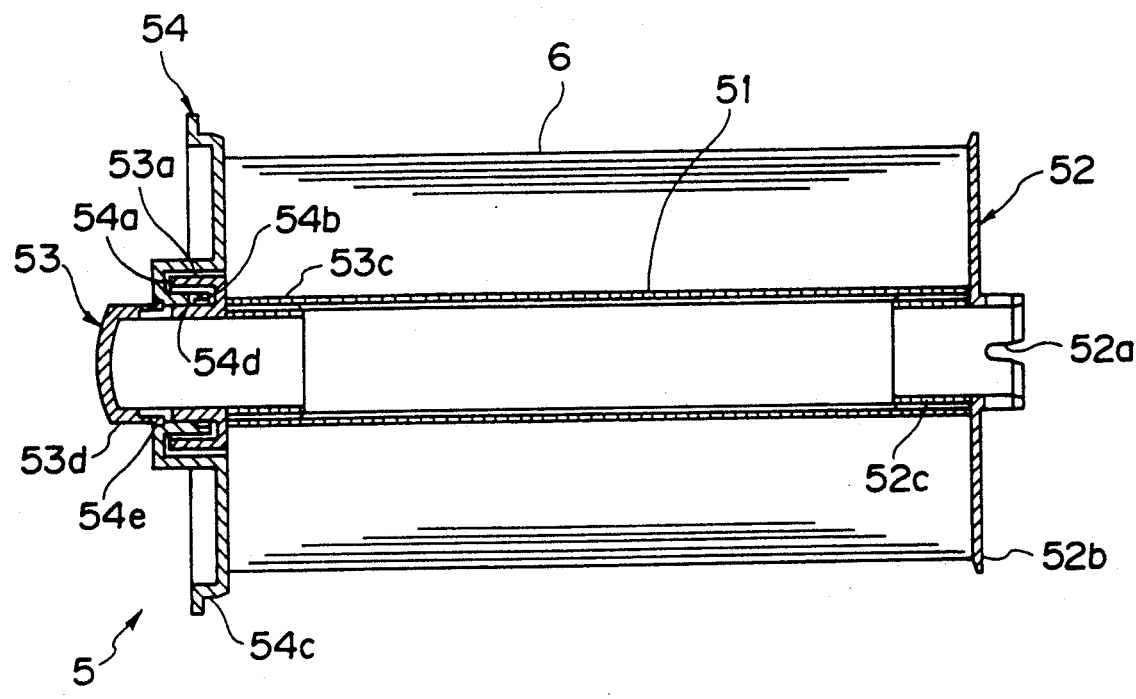
FIG. 3 is a sectional view showing the cartridge shown in FIG. 2.

FIG. 3 is a sectional view showing the cartridge 5 according to the invention. A rear flange 52 is secured to one end of the core 51, and it is in close contact with one end face of the roll to shield light from the photosensitive sheet P. To the other end of the core 51 is secured a core cap 53, on which a cover flange 54 is fitted. At the time of the packing of the roll and during storage thereof, the cover flange 54 is at a position in close contact with the other end face of the roll of the photosensitive sheet P, thus shielding light from the other end face of the roll.

Figure 4:
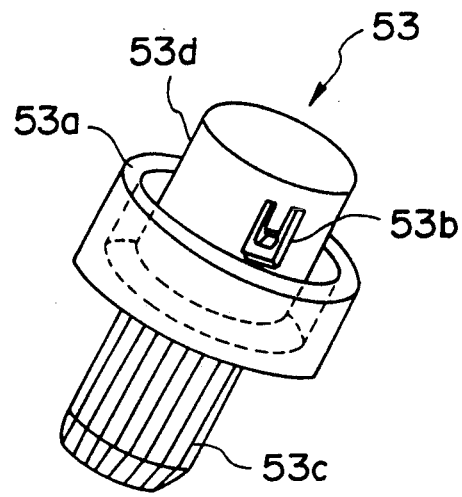
FIG. 4 is a perspective view showing an embodiment of a core cap in the cartridge.

FIG. 4 shows details of the core cap 53. The core cap 53 has its outer periphery provided with a light-shielding flange 53a. On its axially outer side of the flange 53a, the core cap 53 has a cylindrical portion 53d, which has a smooth peripheral surface formed with a lock pawl 53b. On its axially inner side of flange 53, the core cap 53 has a splined portion 53c.

Figure 5:
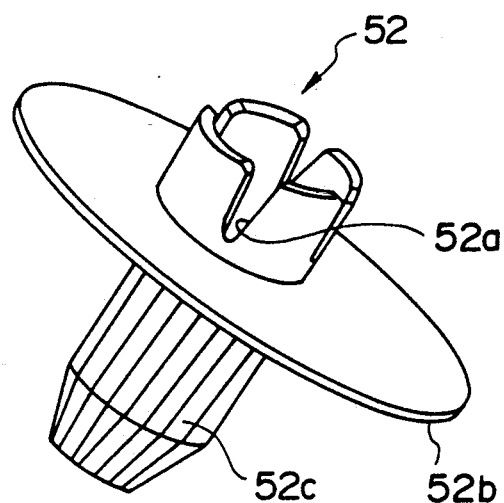
FIG. 5 is a perspective view showing a rear flange in the cartridge.

FIG. 5 shows details of the rear flange 52. The rear flange 52 has a flange portion 52b formed substantially at its axially center position. It has one end formed with a plurality of notches 52a for receiving a drive force and also has an other end formed with a splined portion 52c.

Figure 6:
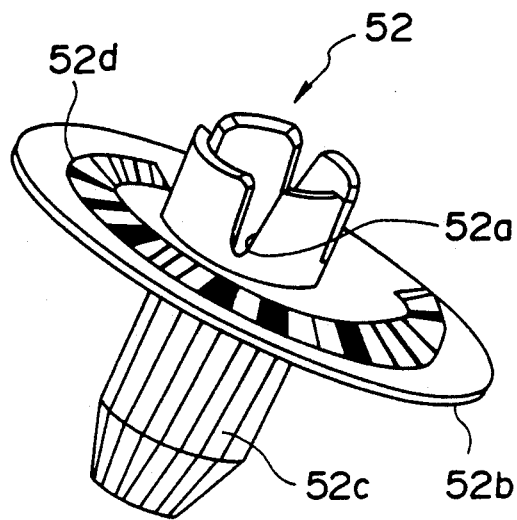
FIG. 6 is a perspective view showing another embodiment of a rear flange in the cartridge.

FIG. 6 shows details of a different example of the rear flange 52. This rear flange 52 again has a flange portion 52b formed substantially at its axially center portion, one end formed with a plurality of notches 52a for receiving a drive force and an other end formed with a splined portion 52c. The flange portion 52b has a bar code seal 52d applied thereonto and having a cartridge code. The bar code seal 52d is arc-shaped and is rotated with the rotation of the rear flange 52.

Figure 7:
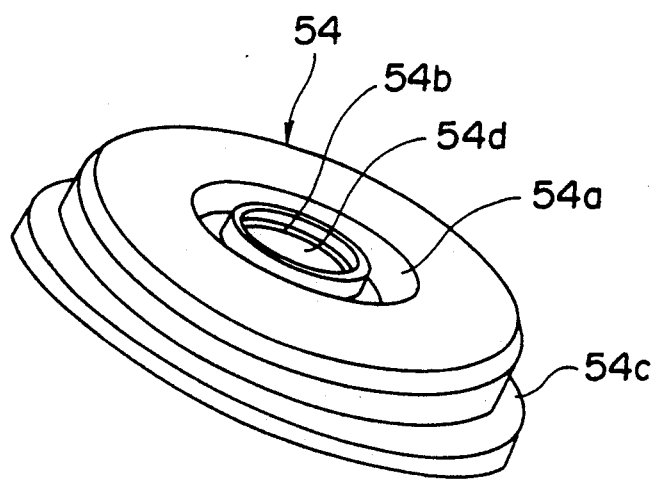
FIG. 7 is a perspective view showing an embodiment of a cover flange in the cartridge.

FIG. 7 shows the cover flange 54 in detail. The cover flange 54 is disk-shaped. It has a center bearing portion 54d, which is supported for rotation on the cylindrical portion 53d of the core cap 53. The inner peripheral surface of the bearing portion 54d is formed with two axially spaced-apart grooves 54b and 54e, with which the lock pawl 53b of the core cap 53 can engage. One groove 54b is shown in FIG. 7. On the outer periphery side of the bearing portion 54d is formed a light-shielding groove 54a for shielding light, into which light-shielding flange 53a of the core cap 53 is inserted. The outer periphery of the cover flange 54 has a guide portion 54c for positioning the cover flange 54 with respect to the body 1 when the cartridge 5 is loaded in the copying machine body 1.

Figure 8:
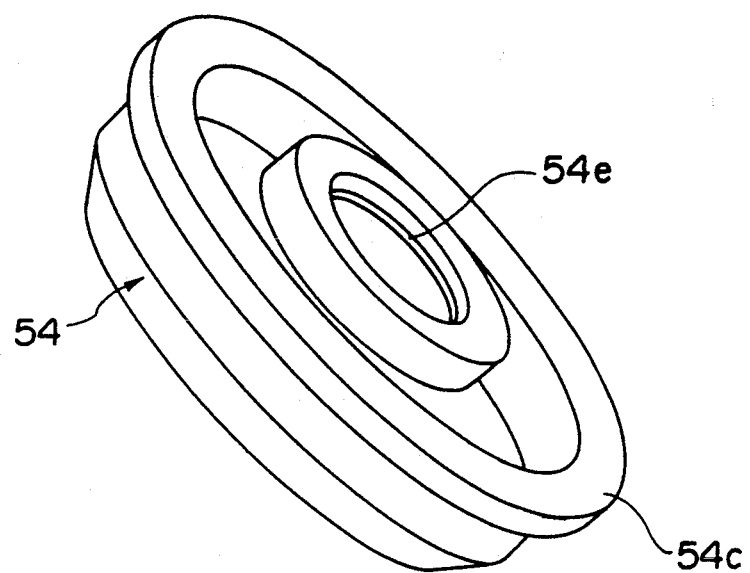
FIG. 8 is a perspective view showing the cover flange of FIG. 7 as viewed from the back side thereof.

FIG. 8 is a view showing the back of the cover flange 54 shown in FIG. 7. As shown in FIG. 8, the cover flange 54 has, at the axially outward position of the bearing portion 54d, the annular groove 54e for engaging with the lock pawl 53b of the core cap 53. The lock pawl 53b and the grooves 54b and 54e form a locking means.

Figure 9:
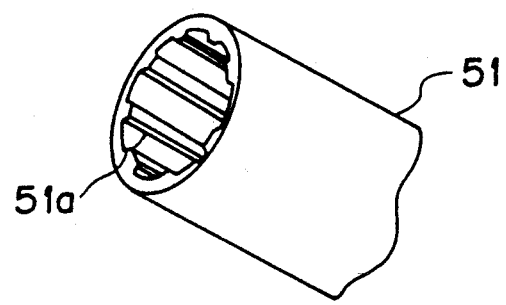
FIG. 9 is a perspective view, partly broken away, showing an embodiment of a core in the cartridge.

FIG. 9 shows the core 51 in detail. The core 51 is cylindrical in shape and has its inner periphery formed with a plurality of splines 51a for engagement with the spline portions 53c, 52c of the core cap 53 and the rear flange 52, respectively.

FIG. 10 shows the cartridge 5 in a state loaded in the copying machine body 1. As shown in FIG. 10, the guide portion 54c of the cover flange 54 is received in a cartridge loading hole g formed in the body 1. Also in this state, a pawl 29a of a coupler 29 supported on a shaft 28 of a drive source provided in the body 1 is received in a notch 52a of the rear flange 52. The coupler 29 is biased by a spring 40 such that it can slide along the shaft 28 only in the axial direction thereof to absorb a phase deviation between the pawl 29a of the coupler 29 and the notch 52a of the rear flange 52. The cover flange 54 is secured to the body 1, and the core cap 53 is supported for rotation with respect to the cover flange 54 while light is shielded from the photosensitive sheet P.

FIGS. 11(A) to 11(C) illustrate the state of lock between the cover flange 54 and the lock pawl 53b of the core cap 53. FIG. 11(A) shows the cartridge 5, in which the cover flange 54 is in close contact with an end face of the photosensitive sheet P, and the cover flange 54 is locked to the core cap 53 at a first position in a state wherein the lock pawl 53b of the core cap 53 is engaged with the groove 54e of the cover flange 54. By fitting the guide portion 54c of the cover flange 54 of the cartridge in the cartridge loading hole g formed in the copying machine body 1 as shown in FIG. 11(B) and then pushing inwardly the core cap 53 as shown in FIG. 11(C), the end face of the photosensitive sheet P is separated from the cover flange 54 to be ready for use. In this state, the lock pawl 53b of the core cap 53 is locked in the other groove 54b, but is capable of rotation with respect to the cover flange 54. Since the cover flange 54 and the photosensitive sheet P are spaced apart from each other in this state, the roll of the photosensitive sheet P can be rotated. At this time, the bar codes 60, 52d and 58 are read by respective bar code readers r disposed opposite to the bar codes.

As has been described in detail in the foregoing, according to the invention, the cartridge 5 is loaded by inserting it into the cartridge loading hole g formed in the copying machine body 1. Thus, it is possible to provide a copying machine, in which there is no need of opening and closing its cover or the like when the cartridge 5 is replaced.

Furthermore, according to the invention, no exclusive casing is necessary, thus permitting provision of a small size and inexpensive cartridge. Further, with the provision of a bar code on at least either the rear flange or the cover flange, these flanges constituting a part of the cartridge 5, it is possible to provide a cartridge which is small in size and inexpensive and permits reliable and error-free reading of the characteristic value or lot No. of the photosensitive sheet as well as permitting use of a simple and inexpensive bar code reader on the copying machine body or the like.

What is claimed is:

1. A cartridge for accomodating a roll of photosensive sheet therein, which comprises:

a core with the photosensitive sheet wound thereon;

a rear flange secured to one end of said core in close contact with one end face of the roll of the photosensitive sheet for shielding light from the photosensitive sheet;

a core cap secured to the other end of said core;

a cover flange engaged with said core cap so as to cover the other end face of the roll for shielding light therefrom, said cover flange being detachably fitted into a cartridge loading hole formed in an outer body of a copying machine; and a locking means disposed between said core cap and cover flange for locking said core cap on said cover flange at a first and a second predetermined positions which are separated from each other in an axial direction of said core cap, said cover flange being in close contact with the other end face of the roll at said first position, said cover flange being separated from the other end face of the roll by pushing said core cap from said first position to said second position so that the roll is capable of rotating.

2. A cartridge according to claim 1, wherein said locking means comprises at least one lock pawl formed on said core cap so as to be elastically deformed and two grooves formed axially separately from each other on a center bearing portion of said cover flange so as to be engaged with said lock pawl.

3. A cartridge according to claim 1, wherein said rear flange is provided with a bar code.

4. A cartridge according to claim 1, further comprising:
- a sheet-like leading piece connected to the photosensitive sheet wound on said core for shielding light from the photosensitive sheet in cooperation with said rear flange and cover flange.

5. A cartridge according to claim 3, wherein said rear flange is provided with a bar code having information for operating conditions in the copying machine, said bar code being on one side surface of said rear flange which is opposite the other side surface located in close contact with one end face of the roll.

6. A cartridge according to claim 1, wherein said core is cylindrical and has an inner periphery formed with a plurality of splines, and each of said rear flange and cover flange has a splined portion fitted into said inner periphery.

7. A copying machine for performing a copying operation using a photosensitive sheet, which comprises:
- a cartridge accommodating a roll of photosensitive sheet and having a rear flange provided at one end of said roll;
- an outer body having a cartridge loading hole for receiving detachably said cartridge, said cover flange being detachably fitted to said cartridge loading hole to prevent said photosensitive sheet from being exposed to light;
- an original support section formed on said outer body;
- an exposure means for exposing said photosensitive sheet;
- a transferring means for transferring the photosensitive sheet along a guide path while the sheet is taken out of said cartridge; and
- a developing means for developing an image on said sheet onto a transfer sheet;

wherein said cartridge includes a core with the photosensitive sheet wound thereon, said rear flange being secured to one end of said core in close contact with one end face of the roll for shielding light from the photosensitive sheet;
- a core cap secured to the other end of said core, said core flange being engaged with said core cap so as to cover the other end face of the roll for shielding light therefrom, said cover flange being detachably fitted into a cartridge loading hole formed in an outer body of a copying machine; and
- a locking means disposed between said core cap and cover flange for locking said core cap on said cover flange at a first and a second predetermined positions which are separated from each other in an axial direction of said core cap, said cover flange being in close contact with the other end face of the roll at said first position, said cover flange being separated from the other end face of the roll by pushing said core cap from said first position to said second position so that the roll is capable of rotating.

8. A cartridge according to claim 7, further comprising:
- a sheet-like leading piece connected to the photosensitive sheet wound on said core for shielding light from the photosensitive sheet in cooperation with said rear flange and cover flange.

9. A cartridge according to claim 7, wherein said rear flange is provided with a bar code.

10. A cartridge according to claim 9, wherein said rear flange is provided with a bar code having information for operating conditions in the copying machine, said bar code being on one side surface of said rear flange which is opposite the other side surface located in close contact with one end face of the roll.

11. A cartridge according to claim 7, wherein said core is cylindrical and has an inner periphery formed with a plurality of splines, and each of said rear flange and cover flange has a splined portion fitted into said inner periphery.

12. A cartridge according to claim 7, wherein said locking means comprises at least one lock pawl formed on said core cap so as to be elastically deformed and two grooves formed axially separately from each other on a center bearing portion of said cover flange so as to be engaged with said lock pawl.

* * * * *